(12) United States Patent
Otani (10) Patent No.: US 9,832,047 B2
(45) Date of Patent: Nov. 28, 2017

(54) PHASE NOISE OPTIMIZATION DEVICE AND PHASE NOISE OPTIMIZATION METHOD

(71) Applicant: ANRITSU CORPORATION, Kanagawa (JP)

(72) Inventor: Toru Otani, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 0 days.

(21) Appl. No.: 15/355,123

(22) Filed: Nov. 18, 2016

(65) Prior Publication Data

US 2017/0264469 A1 Sep. 14, 2017

(30) Foreign Application Priority Data

Mar. 9, 2016 (JP) ................. 2016-045779

(51) Int. Cl.
*H04L 25/03* (2006.01)
*H04L 7/033* (2006.01)
*H04L 12/26* (2006.01)

(52) U.S. Cl.
CPC ........ *H04L 25/03993* (2013.01); *H04L 7/033* (2013.01); *H04L 43/028* (2013.01); *H04L 43/18* (2013.01); *H04L 2025/03783* (2013.01)

(58) Field of Classification Search
CPC .... G01R 29/26; G01R 23/16; G01R 31/3187; H03L 2207/06; H04L 25/03993; H04L 43/028; H04L 43/18; H04L 7/033; H04L 2025/03783
See application file for complete search history.

(56) References Cited

U.S. PATENT DOCUMENTS

| | | | | |
|---|---|---|---|---|
| 7,890,279 B1* | 2/2011 | Chow | ................ | G06F 17/5036 702/72 |
| 2009/0184773 A1* | 7/2009 | Woo | ...................... | H03L 7/0891 331/1 R |
| 2010/0048142 A1* | 2/2010 | Hou | ....................... | G01R 29/26 455/67.13 |
| 2011/0204937 A1* | 8/2011 | Demirkan | .............. | H03L 7/087 327/157 |

FOREIGN PATENT DOCUMENTS

JP 2015-008408 A 1/2015

* cited by examiner

*Primary Examiner* — Vineeta Panwalkar
(74) *Attorney, Agent, or Firm* — Pearne & Gordon LLP (57) ABSTRACT

To provide a phase noise optimization device and a phase noise optimization method which are capable of automatically measuring optimum phase noise according to an offset frequency. There is included a phase noise data generation unit 28 that generates at least two types of phase noise data corresponding to at least two low-pass filters (LPFs) 15*a* and 15*b* selected by a filter selection unit 16 in at least one measurement frequency range, set in advance, out of a plurality of measurement frequency ranges, a comparison unit 29 that compares at least two types of phase noise data, and a phase noise optimization unit 30 that generates optimized phase noise data based on a comparison result of the comparison unit 29.

9 Claims, 4 Drawing Sheets

PHASE NOISE OPTIMIZATION DEVICE AND PHASE NOISE OPTIMIZATION METHOD

TECHNICAL FIELD

The present invention relates to a phase noise optimization device and a phase noise optimization method, and particularly relates to a phase noise optimization device and a phase noise optimization method for optimizing phase noise of a PLL circuit which is mounted in a spectrum analyzer.

BACKGROUND ART

A phase locked loop (PLL) circuit having high phase noise performance is suitably used as a spectrum analyzer or an oscillation circuit such as a signal generator (see, for example, Patent Document 1).

Figure 4:
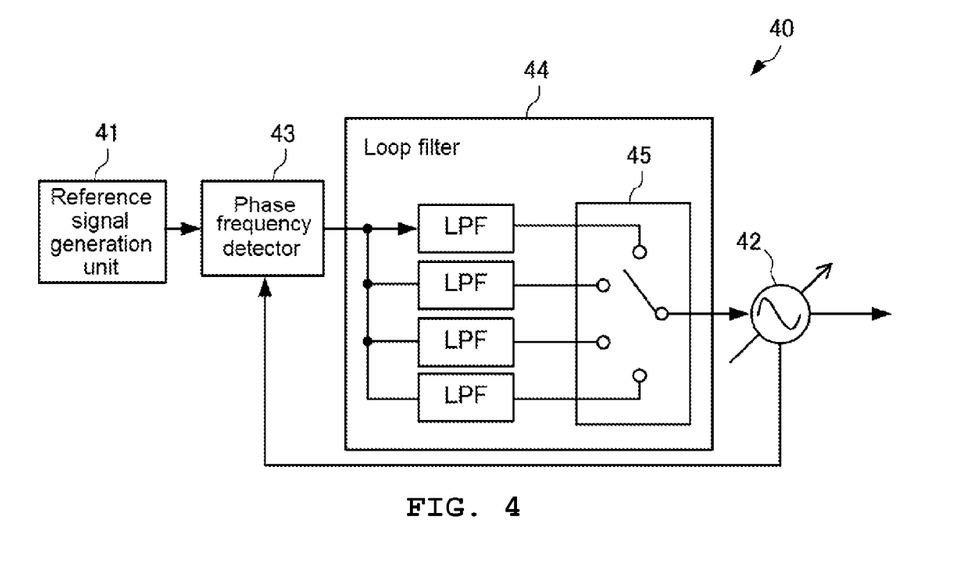
FIG. 4 is a block diagram illustrating a configuration of a PLL circuit of the related art.

FIG. 4 shows a basic configuration of a PLL circuit of the related art. A PLL circuit 40 of the related art includes a reference signal generation unit 41 that generates a reference signal, a voltage controlled oscillator (VCO) 42 that controls the frequency of an output signal in accordance with the voltage of an input signal, a phase frequency detector (PFD) 43 that outputs a phase difference signal according to a phase difference between the output signal from the VCO 42 and the reference signal, and a loop filter 44 that allows passage of a low-frequency component of the phase difference signal to input the low-frequency component to the VCO 42.

The PLL circuit 40 includes a plurality of low-pass filters (LPFs) having different frequency ranges which are capable of reduce phase noise, as the loop filter 44 for optimizing the phase noise for each offset frequency. The term "offset frequency" as used herein refers to a frequency indicated using the center frequency of the output signal from the VCO 42 of the PLL circuit 40 as a reference (zero). The plurality of LPFs are configured such that only one LPF is selected by a switch 45.

RELATED ART DOCUMENT

Patent Document

[Patent Document 1] JP-A-2015-8408

DISCLOSURE OF THE INVENTION

Problem that the Invention is to Solve

In a PLL circuit of the related art, in order to optimize phase noise, a setting for switching LPFs to be used for each offset frequency has been required to be performed by a user himself (or herself). However, it is not easy for a user who is not a person skilled in the art to determine an LPF in which phase noise is minimized in accordance with an offset frequency. In addition, a plurality of measurement data are generated by switching the LPFs to perform measurement, but work for a user himself (or herself) to extract data having minimized phase noise for each offset frequency from these data using commercially available spreadsheet software or the like has taken time and labor.

The present invention is contrived in order to solve such a problem of the related art, and an object thereof is to provide a phase noise optimization device and a phase noise optimization method which are capable of automatically measuring optimum phase noise according to an offset frequency, without a user himself (or herself) performing setting for switching a plurality of LPFs constituting a loop filter.

Means for Solving the Problem

In order to solve the above problem, there is provided a phase noise optimization device including: a phase-locked loop (PLL) circuit including a reference signal generation unit that generates a reference signal, a voltage controlled oscillating unit that controls a frequency of an output signal in accordance with a voltage of an input signal, a phase frequency detector that outputs an error signal according to a frequency difference and a phase difference between the output signal from the voltage controlled oscillating unit and the reference signal, and a loop filter provided with a plurality of low-pass filters having different cutoff frequencies and a filter selection unit that selects one low-pass filter from the plurality of low-pass filters, the loop filter allowing passage of a low-frequency component of the error signal through a low-pass filter selected by the filter selection unit to input the low-frequency component to the voltage controlled oscillating unit; an analog-to-digital (A/D) converter that converts the output signal into time domain data as digital data; and a phase noise calculation unit that calculates each phase noise from the time domain data, and generates each of a plurality of phase noise data of a frequency domain, wherein the phase noise calculation unit includes a phase noise data generation unit that generates each of at least two types of phase noise data by sequentially switching the plurality of low-pass filters, a comparison unit that compares the at least two types of phase noise data generated by the phase noise data generation unit, and a phase noise optimization unit that generates optimized phase noise data based on a comparison result of the comparison unit.

With such a configuration, it is possible to automatically measure optimum phase noise according to an offset frequency without a user himself (or herself) performing a setting for switching the plurality of low-pass filters (LPFs) constituting the loop filter.

In addition, in the phase noise optimization device, the comparison unit compares a magnitude relation between phase noises of the at least two types of phase noise data generated by the phase noise data generation unit for each frequency, and in a case where a smallest value of phase noise for each frequency is a value of one type of phase noise data which is consecutive over a predetermined frequency range or greater with respect to the at least two types of phase noise data, the phase noise optimization unit generates optimized phase noise data having a value of the one type of phase noise data which is consecutive over the predetermined frequency range or greater.

With such a configuration, on a condition that the smallest value of phase noise for each frequency is a value of one type of phase noise data which is consecutive over a predetermined frequency range or greater, optimized phase noise data having a value of the one type of phase noise data is generated, and thus it is possible to obtain an optimum phase noise curve while avoiding the influence of a spurious component.

In addition, in the phase noise optimization device, the number of low-pass filters included in the loop filter may be two.

In addition, there is provided a phase noise optimization method of optimizing phase noise of a PLL circuit including a reference signal generation unit that generate a reference signal, a voltage controlled oscillating unit that controls a frequency of an output signal in accordance with a voltage of an input signal, a phase frequency detector that outputs an error signal according to a frequency difference and a phase difference between the output signal from the voltage controlled oscillating unit and the reference signal, and a loop filter provided with a plurality of low-pass filters having different cutoff frequencies and a filter selection unit that selects one low-pass filter from the plurality of low-pass filters, the loop filter allowing passage of a low-frequency component of the error signal through a low-pass filter selected by the filter selection unit to input the low-frequency component to the voltage controlled oscillating unit, the method including: an A/D conversion step of converting a signal to be measured into time domain data as digital data; and a phase noise calculation step of calculating each phase noise from the time domain data, and generating each of a plurality of phase noise data of a frequency domain, wherein the phase noise calculation step includes a phase noise data generation step of generating each of at least two types of phase noise data by sequentially switching the plurality of low-pass filters, in at least one measurement frequency range out of a plurality of measurement frequency ranges, a comparison step of comparing the at least two types of phase noise data generated in the phase noise data generation step, and a phase noise optimization step of generating optimized phase noise data based on a comparison result in the comparison step.

With such a configuration, it is possible to automatically measure optimum phase noise according to an offset frequency without a user himself (or herself) performing a setting for switching the plurality of LPFs constituting the loop filter.

In addition, in the phase noise optimization method, the comparison step includes comparing a magnitude relation between phase noises of the at least two types of phase noise data generated in the phase noise data generation step for each frequency, and in a case where a smallest value of phase noise for each frequency is a value of one type of phase noise data which is consecutive over a predetermined frequency range or greater with respect to the at least two types of phase noise data, the phase noise optimization step includes generating optimized phase noise data having a value of the one type of phase noise data which is consecutive over the predetermined frequency range or greater.

With such a configuration, on a condition that the smallest value of phase noise for each frequency is a value of one type of phase noise data which is consecutive over a predetermined frequency range or greater, optimized phase noise data having a value of the one type of phase noise data is generated, and thus it is possible to obtain an optimum phase noise curve while avoiding the influence of a spurious component.

Advantage of the Invention

The present invention provides a phase noise optimization device and a phase noise optimization method which are capable of automatically measuring optimum phase noise according to an offset frequency, without a user himself (or herself) performing setting for switching a plurality of LPFs constituting a loop filter.

BEST MODE FOR CARRYING OUT THE INVENTION

Hereinafter, an embodiment of a phase noise optimization device and a phase noise optimization method according to the present invention will be described with reference to the accompanying drawings. Meanwhile, the term "phase noise" in the present embodiment refers to single sideband (SSB) phase noise [dBc/Hz] which is a ratio between noise power and carrier signal power per bandwidth of 1 Hz at an offset frequency from the carrier frequency (center frequency) of a signal to be measured which is output from a device under test (DUT) 100.

Figure 1:
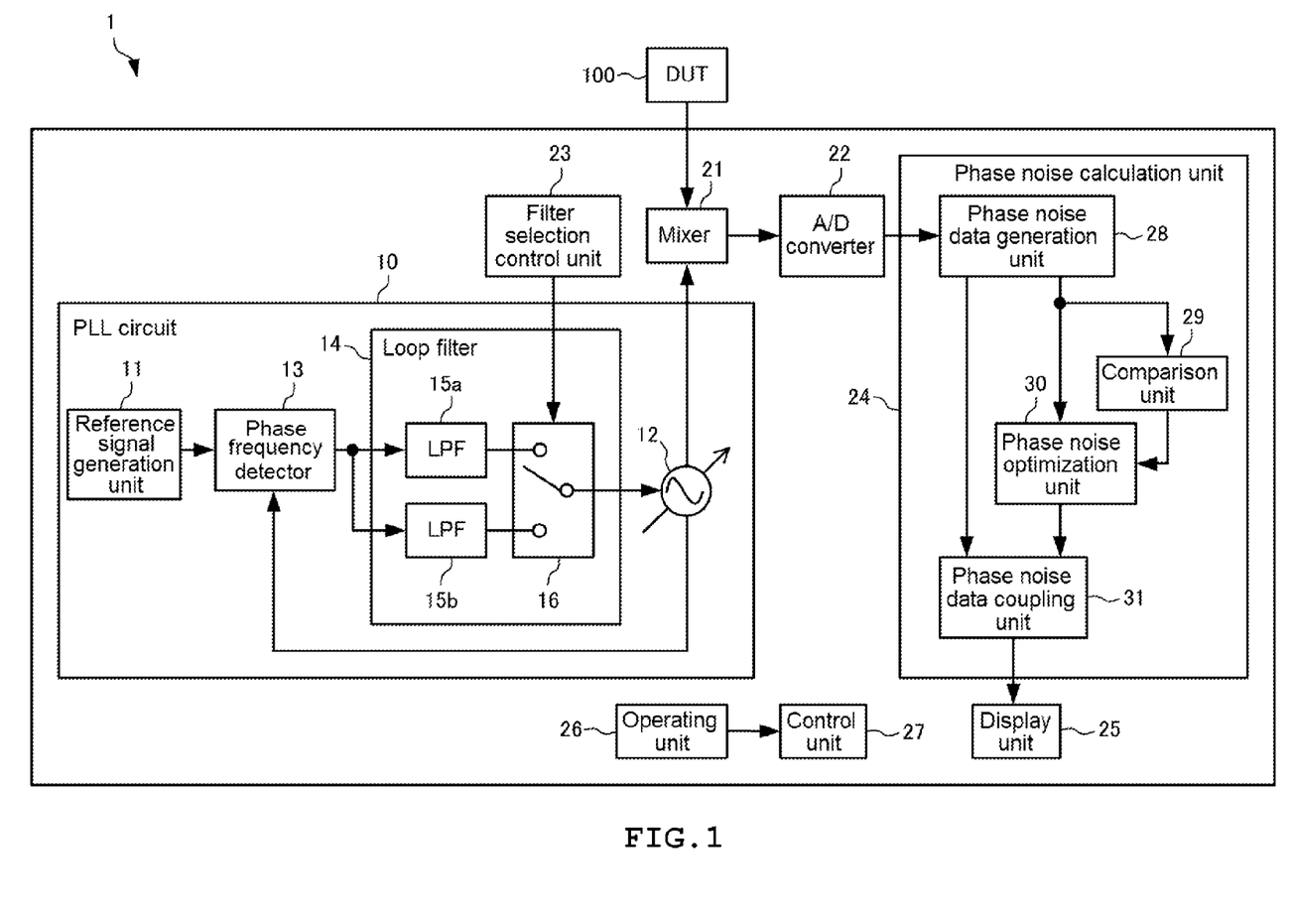
FIG. 1 is a block diagram illustrating a configuration of a phase noise optimization device according to an embodiment of the present invention.

As shown in FIG. 1, a phase noise optimization device 1 according to an embodiment of the present invention includes a phase-locked loop (PLL) circuit 10, a mixer 21 as a frequency conversion unit, an analog-to-digital (A/D) converter 22, a filter selection control unit 23, a phase noise calculation unit 24, a display unit 25, an operating unit 26, and a control unit 27, and is configured to be mounted in, for example, a spectrum analyzer.

The PLL circuit 10 includes a reference signal generation unit 11, a VCO 12 as a voltage controlled oscillating unit, a phase frequency detector 13, and a loop filter 14.

The reference signal generation unit 11 is constituted by a component that frequency-divides a signal of a stable fixed frequency using a programmable frequency divider, a direct digital synthesizer (DDS) that directly generates a signal of a designated frequency, or the like, and is configured to generate a reference signal of a reference frequency.

The VCO 12 is configured to control the frequency of an output signal in accordance with the voltage of an input signal, and specifically to output a signal of an oscillation frequency proportional to the voltage of the input signal as an output signal.

The phase frequency detector 13 is configured to output an error signal according to a frequency difference and a phase difference between the reference signal from the reference signal generation unit 11 and the output signal from the VCO 12. The error signal is, for example, a voltage signal having a pulse width proportional to the frequency difference and the phase difference.

Meanwhile, the PLL circuit 10 may include a frequency conversion unit that converts the frequency of the output signal of the VCO 12 to output the converted frequency to the phase frequency detector 13. In this case, the phase frequency detector 13 outputs an error signal according to a frequency difference and a phase difference between the reference signal from the reference signal generation unit 11 and the output signal from the frequency conversion unit.

The loop filter 14 includes a plurality of low-pass filters (LPFs) 15 having different cutoff frequencies and a switch 16 as a filter selection unit that selects one LPF from the plurality of LPFs 15, and is configured to allow passage of a low-frequency component of an error signal through a LPF selected by the switch 16 to input the low-frequency component to the VCO 12. That is, the output of the phase frequency detector 13 is smoothed by the loop filter 14, and serves as a control voltage of the VCO 12. Here, the cutoff frequency refers to a frequency at which the passage rate of a frequency component is set to 50% (that is, its gain is 0.5) in the pass characteristics of the frequency component of a LPF.

Meanwhile, FIG. 1 shows a configuration in which the loop filter 14 is constituted by two LPFs 15*a* and 15*b*, but the present invention is not limited thereto, and the number of LPFs constituting the loop filter 14 may be three or more.

The mixer 21 is configured to mix (multiply) the output signal from the VCO 12 of the PLL circuit 10 and the signal to be measured from the DUT 100 together, and to frequency-convert the signal to be measured. The A/D converter 22 is configured to sample the signal to be measured which is frequency-converted by the mixer 21 at a predetermined sampling rate, and to convert the sampled signal into time domain data as digital data. Meanwhile, a configuration may be used in which the output signal from the VCO 12 of the PLL circuit 10 is output to the A/D converter 22 without inputting the signal to be measured to the mixer 21. In addition, a configuration may be used in which the mixer 21 is bypassed, and the output signal from the VCO 12 of the PLL circuit 10 is output directly to the A/D converter 22.

The filter selection control unit 23 is configured to store information of the LPF 15 used for each of a plurality of measurement frequency ranges which are set in advance, and to switch the LPF 15 selected by the switch 16 in accordance with each measurement frequency range. Meanwhile, the "measurement frequency range" described above means the measurement range of an offset frequency when phase noise is measured.

The phase noise calculation unit 24 includes a phase noise data generation unit 28, a comparison unit 29, a phase noise optimization unit 30, and a phase noise data coupling unit 31, and is configured to calculate phase noise from the time domain data which is output from the A/D converter 22 for each of a plurality of measurement frequency ranges which are set in advance, and to generate a plurality of phase noise data of a frequency domain.

An interval between frequency points of the phase noise data is larger on the high-frequency side than on the low-frequency side, and is set to, for example, 10 kHz in a measurement frequency range from 100 kHz to 1 MHz.

The phase noise data generation unit 28 generates at least two types of phase noise data by sequentially switching the plurality of low-pass filters.

Particularly, the phase noise data generation unit 28 is configured to generate at least two types of phase noise data based on the error signal having passed through each of at least two LPFs 15*a* and 15*b* selected by the switch 16, in at least one measurement frequency range (hereinafter, also referred to as an "optimized frequency range") which is set in advance among the plurality of measurement frequency ranges.

The comparison unit 29 is configured to compare at least two types of phase noise data in the optimized frequency range generated by the phase noise data generation unit 28. For example, the comparison unit 29 is configured to compare magnitude relations between the at least two types of phase noise data for each frequency point, and to notify the comparison result of the phase noise optimization unit 30.

The phase noise optimization unit 30 is configured to generate optimized phase noise data based on the comparison result of the comparison unit 29. For example, in a case where the smallest value of phase noise for each frequency point is a value of one type of phase noise data which is consecutive over a predetermined frequency range or greater (that is, consecutive over predetermined frequency points) with respect to at least two types of phase noise data in the optimized frequency range, the phase noise optimization unit 30 is configured to generate optimized phase noise data having a value of one type of phase noise data which is consecutive over the predetermined frequency range or greater.

The phase noise data coupling unit 31 is configured to couple the phase noise data, generated by the phase noise data generation unit 28, in measurement frequency ranges other than the optimized frequency range to the optimized phase noise data, generated by the phase noise optimization unit 30, in the optimized frequency range, and to cause the display unit 25 to display the coupled data.

The display unit 25 is constituted by a display device such as, for example, an LCD or a CRT, and is configured to display various display contents in accordance with a control signal from the control unit 27. Such display contents include measurement results of the phase noise coupled by the phase noise data coupling unit 31, and the like. Further, the display unit 25 may display objects to be operated such as buttons, soft keys, a pull-down menu, and a text box for setting measurement conditions or the like.

The operating unit 26 is used for performing a user's operation input, and is configured to include an input device such as a keyboard, a touch panel, or a mouse. Alternatively, as described above, the operating unit 26 may be configured such that objects to be operated such as buttons, soft keys, a pull-down menu, and a text box are displayed on the display unit 25. For example, a user can set the range of an offset frequency desired to be measured, and the like, using the operating unit 26. In addition, a user can also set the frequency of an output signal from the PLL circuit 10 through the operating unit 26.

The control unit 27 is constituted by a microcomputer including, for example, a CPU, a ROM, a RAM and the like, and controls operations of the respective units constituting the phase noise optimization device 1. Further, the control unit 27 executes a predetermined program, and thus is configured to constitute the filter selection control unit 23, the phase noise data generation unit 28, the comparison unit 29, the phase noise optimization unit 30, and the phase noise data coupling unit 31 in a software manner.

Meanwhile, the phase noise optimization device 1 may be configured to be remotely controlled by an external control device through the remote control interface of GPIB, Ethernet®, a USB, or the like.

Figure 2:
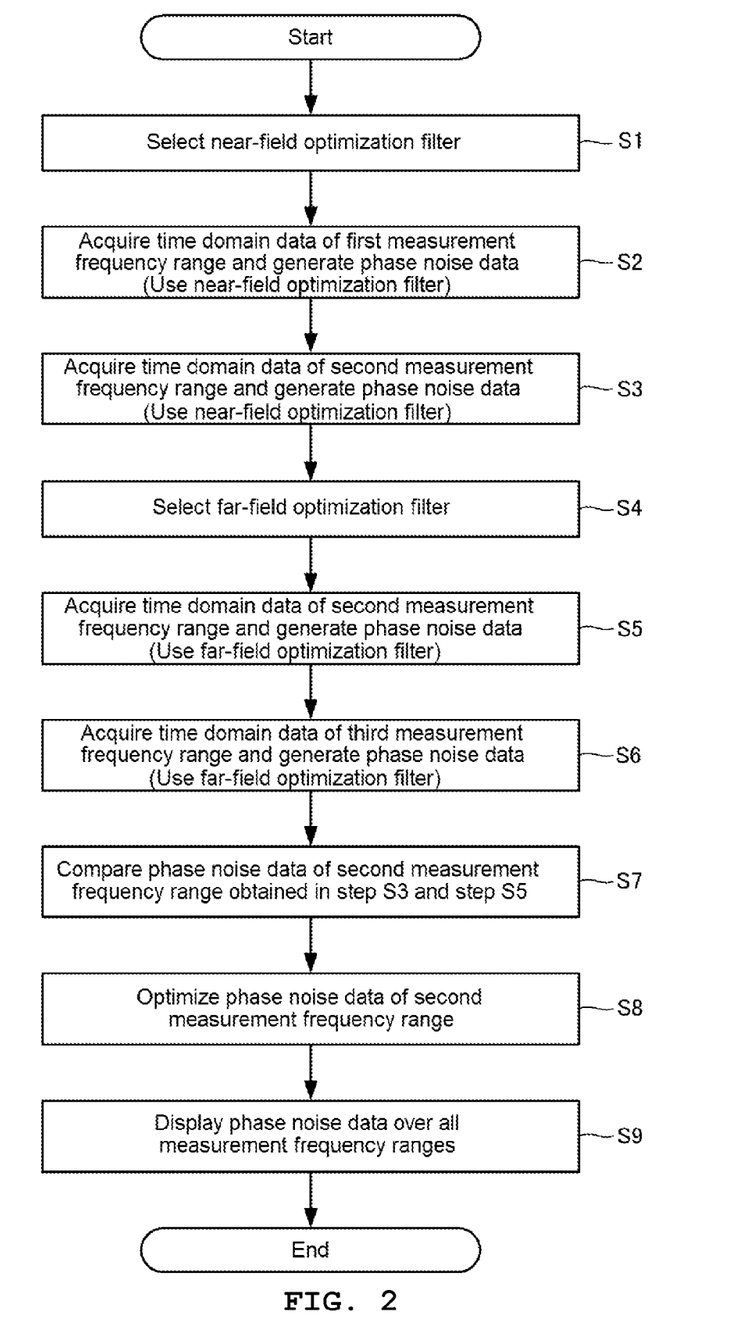
FIG. 2 is a flow diagram illustrating processes in a phase noise optimization method using the phase noise optimization device according to the embodiment of the present invention.

Hereinafter, reference will be made to a flow diagram of FIG. 2 to describe a phase noise optimization method of optimizing phase noise of the PLL circuit 10 using the phase noise optimization device 1 of the present embodiment. In the following, as an example, a measurement frequency range having an offset frequency of 100 Hz to 1 kHz is set to a first measurement frequency range, a measurement frequency range having an offset frequency of 1 kHz to 1 MHz is set to a second measurement frequency range, and a measurement frequency range having an offset frequency of 1 MHz to 10 MHz is set to a third measurement frequency range.

Here, the A/D converter 22 performs sampling of a signal to be measured which is output the mixer 21 at a first sampling rate in the first measurement frequency range, at a second sampling rate in the second measurement frequency range, and at a third sampling rate in the third measurement frequency range. Among these sampling rates, the first sampling rate is lowest, and the third sampling rate is highest.

In addition, the plurality of LPFs 15 are constituted by two LPFs 15a and 15b, and the cutoff frequency of the LPF 15a is assumed to be higher than the cutoff frequency of the LPF 15b. Meanwhile, hereinafter, the LPF 15a is referred to as a "near-field optimization filter", and the LPF 15b is referred to as a "far-field optimization filter".

First, the filter selection control unit 23 selects the near-field optimization filter 15a through the switch 16 (step S1).

Next, the A/D converter 22 converts the signal to be measured which is frequency-converted by the mixer 21 into time domain data as digital data at the first sampling rate. The phase noise data generation unit 28 generates phase noise data corresponding to the near-field optimization filter 15a selected in step S1, in the first measurement frequency range (step S2).

Next, the A/D converter 22 converts the signal to be measured which is frequency-converted by the mixer 21 into time domain data as digital data at the second sampling rate. The phase noise data generation unit 28 generates phase noise data corresponding to the near-field optimization filter 15a selected in step S1, in the second measurement frequency range (step S3).

Next, the filter selection control unit 23 selects the far-field optimization filter 15b through the switch 16 (step S4).

Next, the A/D converter 22 converts the signal to be measured which is frequency-converted by the mixer 21 into time domain data as digital data at the second sampling rate. The phase noise data generation unit 28 generates phase noise data corresponding to the far-field optimization filter 15b selected in step S4, in the second measurement frequency range (step S5).

Next, the A/D converter 22 converts the signal to be measured which is frequency-converted by the mixer 21 into time domain data as digital data at the third sampling rate. The phase noise data generation unit 28 generates phase noise data corresponding to the far-field optimization filter 15b selected in step S4, in the third measurement frequency range (step S6).

Next, the comparison unit 29 compares magnitude relations between two types of phase noise data generated in steps S3 and S5 for each frequency (step S7). Generally, as an offset frequency increases, phase noise obtained through a filter having a low cutoff frequency becomes lower. Here, for example, pieces of phase noise data obtained through the near-field optimization filter 15a and the far-field optimization filter 15b in an interval of 100 kHz to 1 MHz out of the second measurement frequency range (1 kHz to 1 MHz) are compared with each other.

Next, in a case where the value of phase noise data obtained through the near-field optimization filter 15a exceeds the value of the phase noise data obtained through the far-field optimization filter 15b over frequency points, for example, five consecutive points, the phase noise optimization unit 30 generates optimized phase noise data by adopting the value of the phase noise data obtained through the far-field optimization filter 15b from its leading frequency point, on the basis of the comparison result in step S7 (step S8). Meanwhile, in the optimized phase noise data, the value of the phase noise data obtained through the far-field optimization filter 15b is adopted until a frequency point that is one before the leading frequency point.

In step S8, the reason to set "five consecutive points" as a determination criterion is because an erroneous determination is prevented from being made in a case where a spurious component or the like is present in the second measurement frequency range. For example, in a case where an interval between frequency points is 10 kHz, a spurious component is likely to be dispersed to two points. For this reason, for example, the setting of "three consecutive points" as a determination criterion causes the possibility of an erroneous determination being made due to the measurement error for the level of a spurious component and the randomness of noise. Reversely, the setting of the number of frequency points of a determination criterion to be excessively large causes the possibility of a correct determination not being able to be made in a case where a plurality of spurious components are present. However, the present invention is not limited thereto, and the number of any consecutive points may be set as a determination criterion in accordance with an interval between frequency points of phase noise data, or the like.

Next, the phase noise data coupling unit 31 couples the phase noise data, generated in steps S2 and S6, in measurement frequency ranges other than the optimized frequency range to the optimized phase noise data, generated in step S8, in the optimized frequency range, and causes the display unit 25 to display the coupled data (step S9).

Meanwhile, in the above process, it is possible to appropriately omit the processes of steps S2 and S6 in accordance with the range of an offset frequency which is set by a user through the operating unit 26. For example, in a case where the range of an offset frequency which is set by a user is 1 kHz to 10 MHz, it is possible to omit the process of step S2 for the first measurement frequency range (100 Hz to 1 kHz).

Figure 3A:
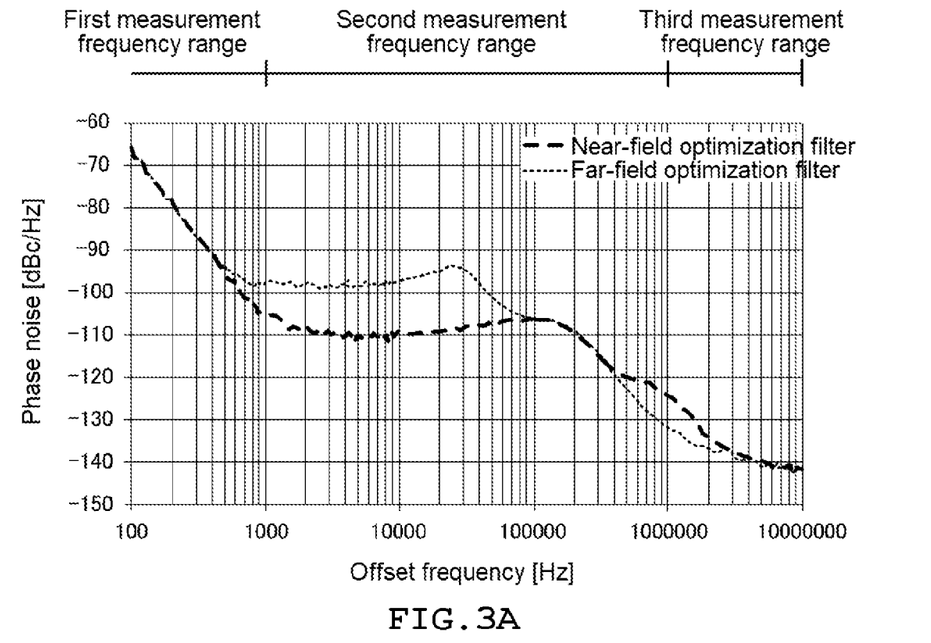
FIGS. 3A and 3B are graphs illustrating phase noise data obtained by the phase noise optimization device according to the embodiment of the present invention.

FIG. 3A is a graph illustrating an example of phase noise data obtained through each of the near-field optimization filter 15a and the far-field optimization filter 15b, in a measurement frequency range of 100 Hz to 10 MHz, in a case where the center frequency of a signal to be measured which is output from the DUT 100 is 1 kHz. Here, this drawing shows results obtained by performing measurement using the near-field optimization filter 15a and the far-field optimization filter 15b with respect to all the frequency ranges of the first to third measurement frequency ranges.

Figure 3B:
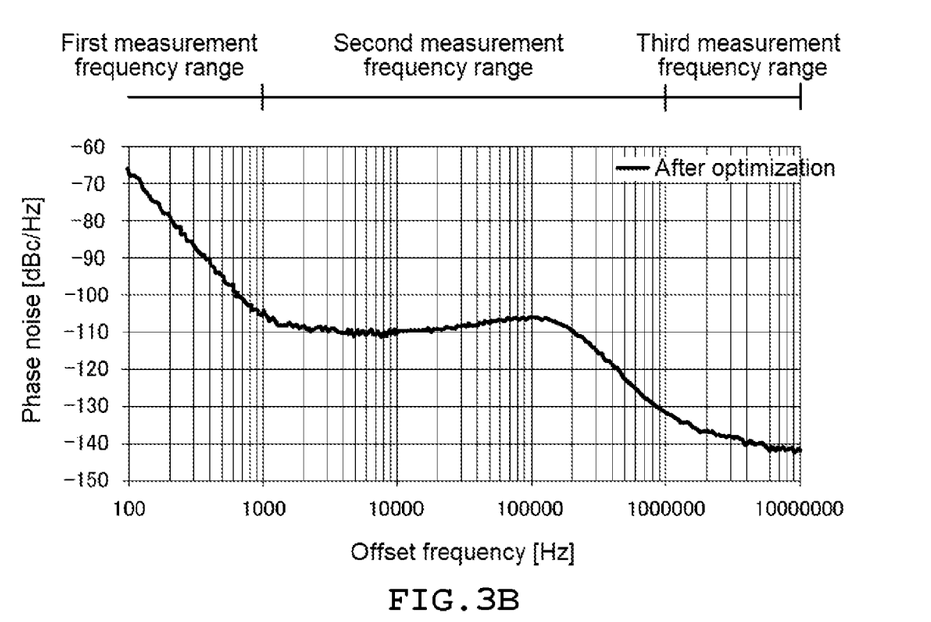

FIG. 3B is a graph illustrating optimized final phase noise data displayed on the display unit 25 with respect to the phase noise data shown in FIG. 3A. As shown in this graph, phase noise data of the near-field optimization filter 15a is adopted in the first measurement frequency range, and phase noise data of the far-field optimization filter 15b is adopted in the third measurement frequency range. Thereby, it is possible to suppress phase noise of the PLL circuit 10, and to measure phase noise of a signal to be measured with a good degree of accuracy.

On the other hand, in the second measurement frequency range, phase noise data of the near-field optimization filter 15a is adopted until 230 kHz, and phase noise data of the far-field optimization filter 15b is adopted until 240 kHz. Thereby, it is possible to suppress the phase noise of the PLL circuit 10, and to measure the phase noise of a signal to be measured with a good degree of accuracy. In addition, the phase noise optimization device 1 according to the present invention is mounted in a spectrum analyzer, including the display unit 25, which measures the spectrum of a signal to be measured, and can display the measurement results of the signal to be measured, on the display unit 25.

As described above, the phase noise optimization device 1 according to the present embodiment is configured to switch two LPFs 15a and 15b in a predetermined measurement frequency range to generate two types of phase noise data. In addition, the phase noise optimization device 1 generates optimized phase noise data by combining two types of phase noise data.

Thereby, a user himself (or herself) does not perform an operation for switching the plurality of LPFs 15 constituting the loop filter 14, or the like, and an optimum phase noise curve according to an offset frequency can be automatically measured. Thus, even a user who is not a person skilled in the art can easily measure an optimum phase noise curve without being particularly aware of the curve.

In addition, the phase noise optimization device 1 according to the present embodiment switches phase noise data to be adopted, using the fact that the value of the phase noise data obtained through the near-field optimization filter 15a exceeds the value of the phase noise data obtained through the far-field optimization filter 15b over frequency points, for example, five consecutive points, as a determination criterion, and thus it is possible to obtain an optimum phase noise curve while avoiding the influence of a spurious component.

DESCRIPTION OF REFERENCE NUMERALS AND SIGNS

1: Phase noise optimization device
10: PLL circuit
11: Reference signal generation unit
12: Voltage controlled oscillating unit (VCO)
13: phase frequency detector
14: Loop filter
15, 15a: Low-pass filter (LPF, near-field optimization filter)
15, 15b: Low-pass filter (LPF, far-field optimization filter)
16: Switch (filter selection unit)
21: Mixer (frequency conversion unit)
22: A/D converter
23: Filter selection control unit
24: Phase noise calculation unit
25: Display unit
26: Operating unit
27: Control unit
28: Phase noise data generation unit
29: Comparison unit
30: Phase noise optimization unit
31: Phase noise data coupling unit
100: Device under test (DUT)

What is claimed is:

1. A phase noise optimization device comprising:
   a phase-locked loop (PLL) circuit including:
   a reference signal generation unit that generates a reference signal,
   a voltage controlled oscillating unit that controls a frequency of an output signal in accordance with a voltage of an input signal,
   a phase frequency detector that outputs an error signal according to a frequency difference and a phase difference between the output signal from the voltage controlled oscillating unit and the reference signal, and
   a loop filter provided with a plurality of low-pass filters having different cutoff frequencies and a filter selection unit that selects one low-pass filter from the plurality of low-pass filters, the loop filter allowing passage of a low-frequency component of the error signal through a low-pass filter selected by the filter selection unit to input the low-frequency component to the voltage controlled oscillating unit;
   an analog-to-digital (A/D) converter that converts the output signal into time domain data as digital data; and
   a phase noise calculation unit that calculates phase noise from the time domain data, and generates a plurality of phase noise data of a frequency domain,
   wherein the phase noise calculation unit includes:
   a phase noise data generation unit that generates each of at least two types of phase noise data by sequentially switching the plurality of low-pass filters,
   a comparison unit that compares the at least two types of phase noise data generated by the phase noise data generation unit, and
   a phase noise optimization unit that generates optimized phase noise data based on a comparison result of the comparison unit.

2. The phase noise optimization device according to claim 1, wherein the phase noise calculation unit calculates phase noise from the time domain data for each of a plurality of measurement frequency ranges which are set in advance, and generates the plurality of phase noise data of a frequency domain.

3. The phase noise optimization device according to claim 1, wherein the comparison unit compares a magnitude relation between phase noises of the at least two types of phase noise data generated by the phase noise data generation unit for each frequency, and
   in a case where a smallest value of phase noise for each frequency is a value of one type of phase noise data which is consecutive over a predetermined frequency range or greater with respect to the at least two types of phase noise data, the phase noise optimization unit generates optimized phase noise data having a value of the one type of phase noise data which is consecutive over the predetermined frequency range or greater.

4. The phase noise optimization device according to claim 1, wherein the number of low-pass filters included in the loop filter is two.

5. A spectrum analyzer comprising:
   the phase noise optimization device according to claim 1; and
   a phase noise data coupling unit that couples phase noise data in frequency ranges other than a measurement frequency range generated by the phase noise data generation unit to optimized phase noise data in the measurement frequency range generated by the phase noise optimization unit,
   wherein the spectrum analyzer measures a phase noise curve according to an offset frequency using the phase noise data for each of a plurality of measurement frequency ranges which are set in advance, and displays the measured curve on the display unit.

6. A phase noise optimization method of optimizing phase noise of a phase-locked loop (PLL) circuit including:
   a reference signal generation unit that generate a reference signal,
   a voltage controlled oscillating unit that controls a frequency of an output signal in accordance with a voltage of an input signal,
   a phase frequency detector that outputs an error signal according to a frequency difference and a phase difference between the output signal from the voltage controlled oscillating unit and the reference signal, and
   a loop filter provided with a plurality of low-pass filters having different cutoff frequencies and a filter selection unit that selects one low-pass filter from the plurality of low-pass filters, the loop filter allowing passage of a low-frequency component of the error signal through a low-pass filter selected by the filter selection unit to input the low-frequency component to the voltage controlled oscillating unit, the method comprising:

an analog-to-digital (A/D) conversion step of converting a signal to be measured into time domain data as digital data; and a phase noise calculation step of calculating phase noise from the time domain data, and generating a plurality of phase noise data of a frequency domain, wherein the phase noise calculation step includes:

a phase noise data generation step of generating at least two types of phase noise data by sequentially switching the plurality of low-pass filters, in at least one measurement frequency range out of a plurality of measurement frequency ranges, a comparison step of comparing the at least two types of phase noise data generated in the phase noise data generation step, and a phase noise optimization step of generating optimized phase noise data based on a comparison result in the comparison step.

7. The phase noise optimization method according to claim 6, wherein the phase noise calculation step includes calculating phase noise from the time domain data for each of a plurality of measurement frequency ranges which are set in advance, and generating plurality of phase noise data of a frequency domain.

8. A spectrum analyzing method comprising:

the phase noise optimization method according to claim 6; and a step of coupling phase noise data in frequency ranges other than a measurement frequency range generated by the phase noise data generation unit to optimized phase noise data in the measurement frequency range generated by the phase noise optimization unit, measuring a phase noise curve according to an offset frequency using the phase noise data for each of a plurality of measurement frequency ranges which are set in advance, and displaying the measured curve on the display unit.

9. The phase noise optimization method according to claim 6, wherein the comparison step includes comparing a magnitude relation between phase noises of the at least two types of phase noise data generated in the phase noise data generation step for each frequency, and in a case where a smallest value of phase noise for each frequency is a value of one type of phase noise data which is consecutive over a predetermined frequency range or greater with respect to the at least two types of phase noise data, the phase noise optimization step includes generating optimized phase noise data having a value of the one type of phase noise data which is consecutive over the predetermined frequency range or greater.

* * * * *